United States Patent
Chen et al.

(10) Patent No.: US 8,722,475 B2
(45) Date of Patent: May 13, 2014

(54) METHOD AND STRUCTURE FOR HIGH Q VARACTOR

(75) Inventors: Zhen Chen, Shanghai (CN); Yung Feng Lin, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/986,123

(22) Filed: Jan. 6, 2011
(Under 37 CFR 1.47)

(65) Prior Publication Data
US 2012/0139020 A1    Jun. 7, 2012

(30) Foreign Application Priority Data

Jan. 8, 2010    (CN) ...................... 2010 1 0022580 A

(51) Int. Cl.
*H01L 21/338*    (2006.01)
(52) U.S. Cl.
USPC ........................................... 438/171
(58) Field of Classification Search
USPC ........... 257/296, E21.409, E27.011; 438/239, 438/171
See application file for complete search history.

(56) References Cited

U.S. PATENT DOCUMENTS

| | | |
|---|---|---|
| 5,405,790 A | 4/1995 | Rahim et al. |
| 5,747,865 A | 5/1998 | Kim et al. |
| 6,172,378 B1 | 1/2001 | Hull et al. |
| 2010/0244113 A1* | 9/2010 | Rieh et al. ...................... 257/312 |
| 2010/0244138 A1* | 9/2010 | Benaissa et al. .............. 257/368 |

FOREIGN PATENT DOCUMENTS

CN    1567596 A    1/2005

* cited by examiner

*Primary Examiner* — Elias M Ullah
(74) *Attorney, Agent, or Firm* — Kilpatrick Townsend & Stockton LLP

(57) ABSTRACT

A method for forming a variable capacitor includes providing a semiconductor substrate of a first conductivity type and forming an active region of a second conductivity type within the substrate. The method forms a first dielectric layer overlying the active region. The method provides a conductive gate layer over the first dielectric layer and selectively patterns the conductive gate layer to form a plurality of holes in the conductive gate layer. A perimeter of the holes and a spacing between a first and a second holes are selective to provide a high quality factor (Q) of the capacitor. The method implants impurities of the second conductivity type into the active region through the plurality of holes in the conductive layer. The method also includes providing a second dielectric layer and patterning the second dielectric layer to form contacts to the active region and the gate.

16 Claims, 6 Drawing Sheets

METHOD AND STRUCTURE FOR HIGH Q VARACTOR

CROSS-REFERENCES TO RELATED APPLICATIONS

This application claims priority to Chinese Patent Application No. 201010022580, filed Jan. 8, 2010, which is commonly owned and incorporated by reference herein for all purposes in its entirety.

BACKGROUND OF THE INVENTION

Embodiments of the present invention relate to integrated circuits and the processing for the manufacture of semiconductor devices. In particular, embodiments of the invention provide a method and device for varactors used in integrated circuits. More particularly, embodiments of the invention provide a method and device for device layout to reduce series resistance and parasitic capacitance. Merely by way of example, the invention has been applied to achieving high quality factor (Q) of a variable capacitor for the manufacture of integrated circuits. But it would be recognized that the invention has a much broader range of applicability. For example, the invention can be applied to integrated circuit layout of devices sensitive to parasitic resistance and capacitance, such as resistors, inductors, and transistors, etc.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is variable capacitors, also known as varactors, used for the manufacture of integrated circuits in a cost effective and efficient way.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor Manufacturing International Corporation (SMIC) of Shanghai, China is an example of a chip company that performs foundry services. Although fabless chip companies and foundry services have increased through the years, many limitations in design process technology still need to be overcome. For example, variable capacitors, also known as varactors, are used extensively in mixed signal and RF circuit designs, such as tunable voltage controlled oscillators (VCOs) in multi-frequency carriers. The quality of a varactor is often measured by a ratio of its capacitance to its series resistance, also known as a quality factor (Q). In order to obtain a high Q-factor, the series resistance must be reduced. In addition, the capacitance tuning range of a varactor can be improved with reduced parasitic capacitances.

FIG. 1 is a top-view diagram of a conventional finger-type MOS varactor 100. As shown, varactor 100 includes an active region 110 in a substrate, and contacts such as 115 formed in the active region. Varactor 100 also includes polysilicon gate 120 and a number of contacts, such as 125, formed on the polysilicon gate. The capacitance is provided by an MOS capacitor such as 140 where a finger-shaped polysilicon gate overlaps the active area with a dielectric layer (not shown) between the polysilicon gate 120 and active region 110.

FIG. 2 is a 3-dimensional-view diagram of a branch of a conventional finger-type MOS varactor. As shown, capacitor 200 includes a semiconductor substrate 210, gate oxide 215, and a polysilicon gate 240 which may represent a finger of a finger-shaped varactor. Source and drain (S/D) regions 220 and 230 are heavily doped to allow contacts to be formed to the substrate. As is known in the art, the small signal capacitance value of an MOS capacitor varies with a change in the voltage applied to its gate. A desired small signal capacitance value is often obtained by applying a suitable bias voltage. However, parasitic resistances and parasitic capacitances associated with an MOS capacitor can degrade its performance as a variable capacitor. In FIG. 2, the effective gate resistance (Rg) is proportional to finger width L while the effective drain resistance (Rd) is proportional to finger length X. As is known in the art, a high resistance value leads to the degradation of the quality factor Q. For example, if X is a constant, the longer the L is, the lower the Q is. Another varactor design consideration is related to parasitic capacitance. The parasitic capacitance between gate and source/drain is proportional to the perimeter where the poly gate is adjacent to the active area. In order to obtain a large capacitance tuning range, a high ratio between a primary capacitance and a parasitic capacitance will be required, which can be interpreted as the ratio between a Poly/AA overlap area and a Poly/AA adjacent perimeter (A/P ratio). The area to perimeter ratio (A/P) can be expressed as follows.

$$(X*L)/(2X+2*L)=X/(2X/L+2). \qquad \text{(Equation 1)}$$

It can be seen from Equation 1 that, if X is a constant, the larger the width L is, the larger the A/P ratio will become. In other words, a large finger width L leads to a low Q factor and a low parasitic capacitance value. Therefore, it is difficult to design a finger-type MOS varactor to achieve both high quality factor and low parasitic capacitance. These and other limitations are described throughout the present specification and more particularly below.

From the above, it is seen that an improved technique for variable capacitor devices is desired.

BRIEF SUMMARY OF THE INVENTION

Embodiments of the present invention provide techniques for fabricating integrated circuit devices. In particular, embodiments of the present invention provide a method and device for varactors used in integrated circuits. More particularly, embodiments of the present invention provide a method and device for device layout to reduce series resistance and parasitic capacitance. Merely by way of example, the invention has been applied to achieving high quality factor (Q) of a variable capacitor for the manufacture of integrated circuits. But it would be recognized that the invention has a much broader range of applicability. For example, embodiments of the present invention can be applied to integrated circuit layout of devices sensitive to parasitic resistance and capacitance, such as resistors, inductors, and transistors, etc.

A specific embodiment of the present invention provides a method for forming a variable capacitor. The method includes providing a semiconductor substrate which includes a surface region. In a specific embodiment, the substrate is characterized by a first conductivity type, for example, P-type. The method includes forming an active region within the substrate. The active region is characterized by a second conductivity type. In a specific embodiment, the active region is N-type. The method forms a first dielectric layer overlying the active region. In a specific embodiment, the method provides a conductive gate layer over the first dielectric layer, and selectively patterns the conductive gate layer to form a number of holes in the conductive gate layer. The perimeter of the holes is characterized by a predetermined length, and a spacing between a first and a second holes is characterized by a predetermined distance. In an embodiment, the method includes implanting impurities of the second conductivity type into the active region through the holes in the conductive gate layer. The method then provides a second dielectric layer, and patterns the second dielectric layer to form a group of contact holes through the holes in the conductive gate layer to expose the active region. The method also patterns the second dielectric layer to form a second group of contact holes to expose the conductive gate layer. In a specific embodiment, the method forms a first group of conductive contact structures in the first plurality of contact holes. The first plurality of conductive contact structures form physical contacts with the active region. The method also forms a second group of conductive contact structures in the second plurality of contact holes. The second group of conductive contact structures are in physical contact with the conductive gate layer.

Depending upon the embodiments, the perimeter length and the spacing are selected to achieve a predetermined quality factor Q. For example, the perimeter length is less than 0.3 um, and the spacing is less than 0.13 um in a specific embodiment. As another example, the perimeter length is less than 0.3 um, and the spacing is less than 0.5 um. In a specific embodiment, the dielectric layer is characterized by thickness range of about 5-20 nm. In another embodiment, the dielectric layer thickness can be about 20-100 nm. In an embodiment, the method includes forming a first electrode coupled to the first plurality of conductive contact structures, and forming a second electrode coupled to the second plurality of conductive contact structures. The first and second electrodes form the terminals of the variable capacitor. In some embodiments, the first conductivity type is P-type and the second conductivity type is N-type. In alternative embodiments, the first conductivity type is N-type and the second conductivity type is P-type. In some embodiments, the holes are square in shape. In certain embodiments, the holes are circular in shape. In some embodiments, the holes can be polygon in shape.

An alternative embodiment of the invention provides a variable capacitor device. The variable capacitor device includes a semiconductor substrate. The substrate is characterized by a first conductivity type. In a specific embodiment, the substrate is P-type. The device includes an active region formed in the substrate. The active region is characterized by a second conductivity type. In an embodiment, the active region is N-type. The device includes a first dielectric layer overlying the active region. The device also includes a conductive gate layer over the first dielectric. The conductive gate layer includes a plurality of holes formed in the gate layer. A perimeter of the holes is characterized by a predetermined length and a spacing between a first and a second holes is characterized by a predetermined distance. The device also includes a plurality of drain regions within the active region. The drain regions are characterized by second conductivity type. The device further includes a first plurality of conductive structures. Each of the first plurality of conductive structures is in physical contact with one of the plurality of drain regions through one of the plurality of holes in the conductive gate layer. The device also includes a second plurality of conductive structures. Each of the second plurality of conductive contact structures is in physical contact with the conductive gate layer.

Depending upon the embodiments, the perimeter length and the spacing are selected to achieve a predetermined quality factor. For example, the perimeter length is less than 0.3 um, and the spacing is less than 0.13 um in a specific embodiment. As another example, the perimeter length is less than 0.3 um, and the spacing is less than 0.5 um. In a specific embodiment, the dielectric layer is characterized by thickness range of about 5-20 nm. In another embodiment, the dielectric layer thickness can be about 20-100 nm. In an embodiment, the method includes forming a first electrode coupled to the first plurality of conductive contact structures, and forming a second electrode coupled to the second plurality of conductive contact structures. The first and second electrodes form the terminals of the variable capacitor.

In some embodiments, the first conductivity type is P-type and the second conductivity type is N-type. In alternative embodiments, the first conductivity type is N-type and the second conductivity type is P-type. In some embodiments, the holes are square in shape. In certain embodiments, the holes are circular in shape. In some embodiments, the holes can be polygon in shape. In an embodiment, the drain regions have a higher conductivity than the active region.

Embodiments of the present invention provide many benefits over conventional techniques. For example, the present technique provides an easy to use process that relies upon conventional technology. Embodiments of the present invention provide device layout techniques for reduced parasitic resistance and capacitance. A specific embodiment of the invention provides a method and device for a variable capacitor having a high quality factor (Q).

A specific embodiment of the invention improves capacitance tuning range of a varactor. Some embodiments of the invention provide layout techniques for achieving high pattern density and design flexibility. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional embodiments, features and advantages of the present invention can be more fully appreciated with reference to the detailed description and accompanying drawings that follow.

BRIEF DESCRIPTION OF THE DRAWINGS

The accompanying drawings, which are incorporated herein and form a part of the specification, illustrate the present invention and, together with the description, further serve to explain embodiments of the invention.

DETAILED DESCRIPTION OF THE INVENTION

Embodiments of the present invention provide techniques for fabricating integrated circuit devices. In particular, embodiments of the invention provide a method and device for varactors used in integrated circuits. More particularly, embodiments of the invention provide a method and device for device layout to reduce series resistance and parasitic capacitance. Merely by way of example, the invention has been applied to achieving high quality factor of a variable capacitor for the manufacture of integrated circuits. But it would be recognized that the invention has a much broader range of applicability. For example, the invention can be applied to integrated circuit layout of devices sensitive to parasitic resistance and capacitance, such as resistors, inductors, and transistors, etc.

Figure 1:
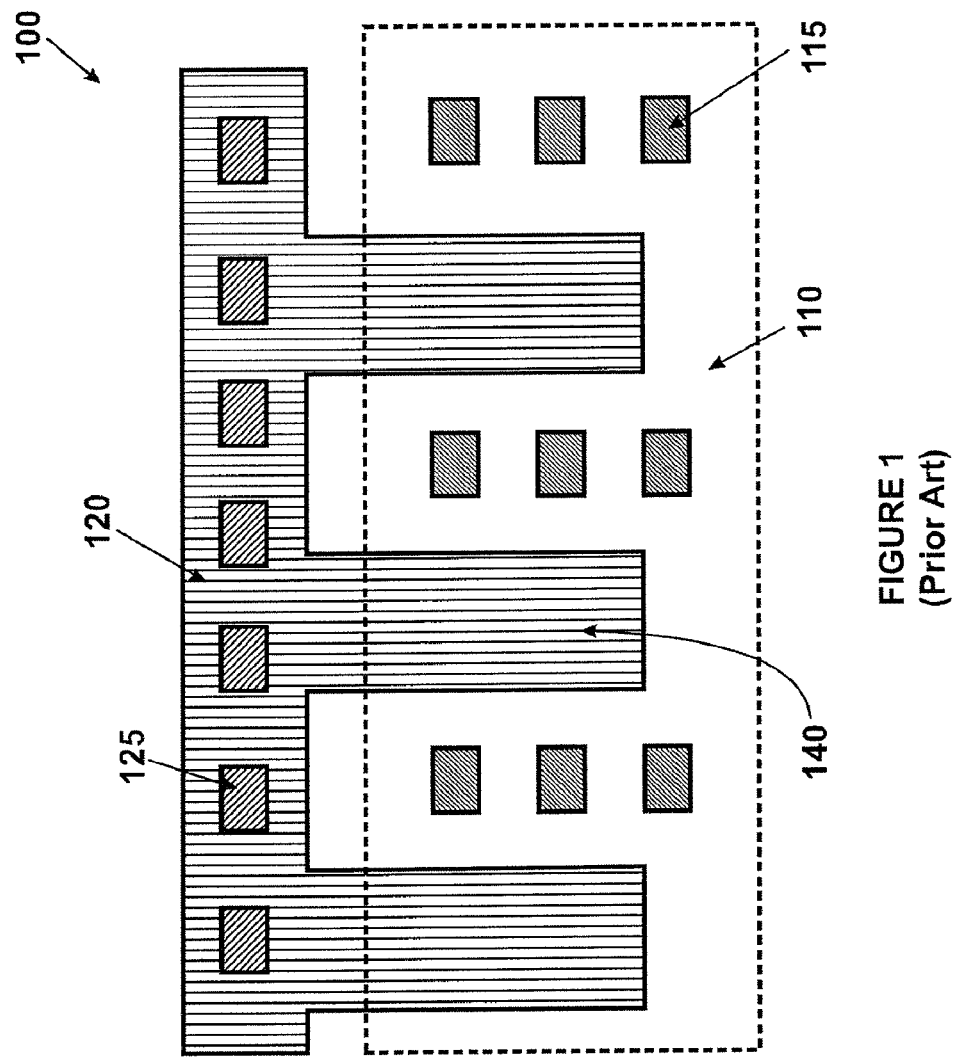
FIG. 1 is a top view layout diagram of a conventional finger-type MOS varactor.
Figure 2:
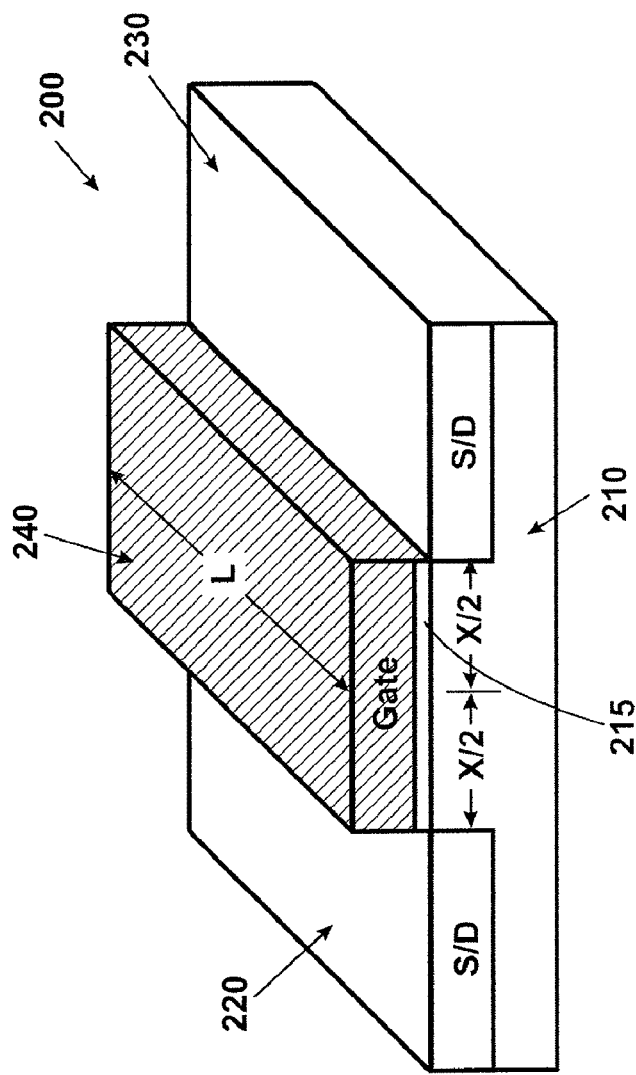
FIG. 2 is 3-dimensional-view diagram of a finger of a conventional finger-type MOS varactor.
Figure 3:
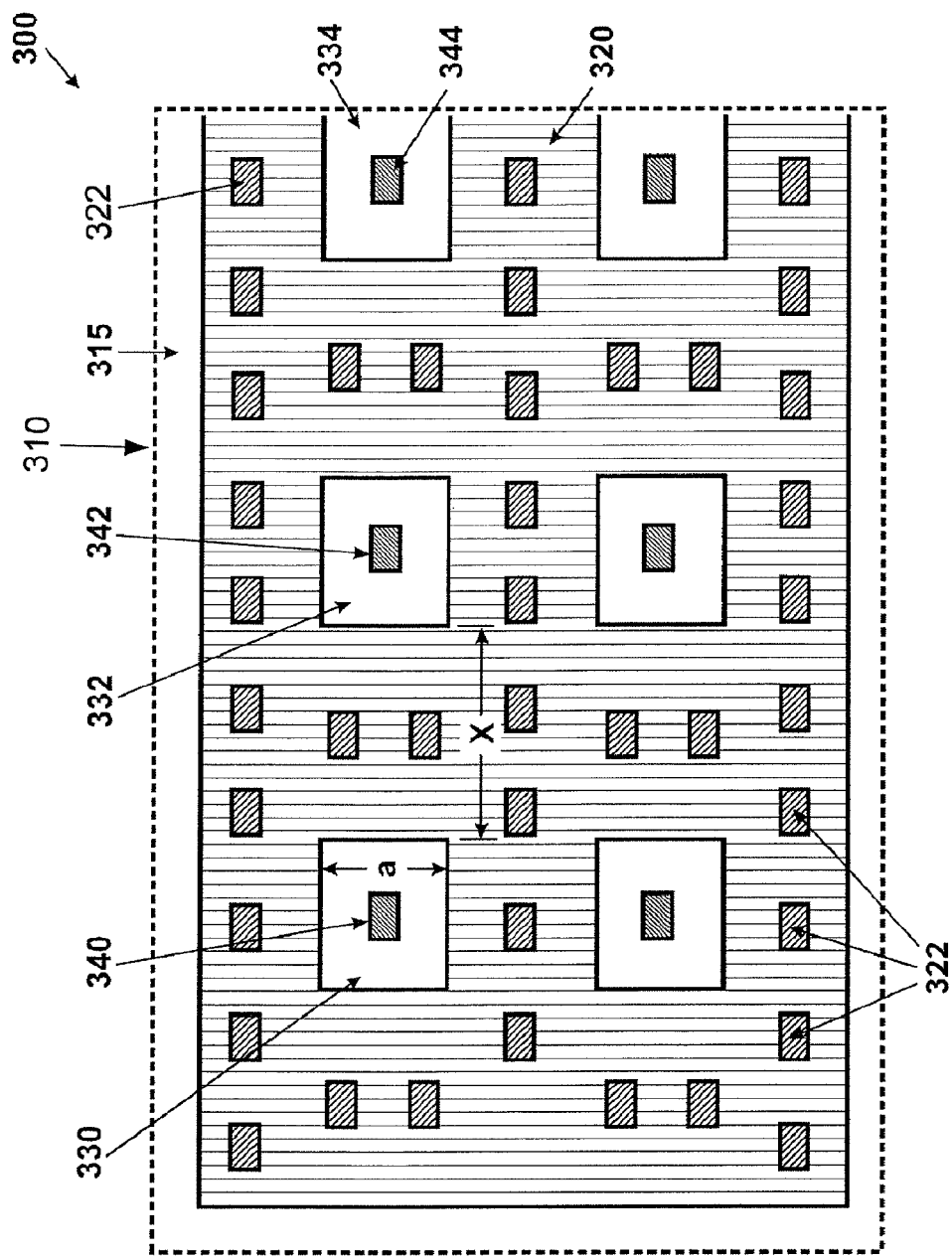
FIG. 3 is a simplified top view layout diagram of a varactor according to an embodiment of the present invention.

FIG. 3 is a simplified top-view layout diagram of a varactor 300 according to an embodiment of the present invention. This diagram is merely an example, which should not unduly limit the scope of the claims herein. One of ordinary skill in the art would recognize other variations, modifications, and alternatives. As shown, varactor 300 includes an active area 310. In an embodiment, active area 310 is a lightly doped region in a semiconductor substrate. In a specific embodiment, the substrate is a P-type silicon substrate, and active area is an N-type lightly doped region. Varactor 300 also includes a dielectric layer 315 overlying active area 310. In an embodiment, the dielectric layer can be oxide. In other embodiments, the dielectric layer can be a gate oxide, nitride, or silicon oxynitride, and the like. The gate oxide is often formed using a thermal oxidation process to form high quality gate oxide, which is free from voids, and the like. Proper gate dielectric layer thicknesses are often required for devices to operate at different voltages. For example, in a specific embodiment, the dielectric layer is characterized by a thickness in a range between 5 nm and 20 nm. In another embodiment, the dielectric layer thickness can be in a range between 20 nm and 100 nm. Varactor 300 also includes a polysilicon gate layer 320 on the dielectric layer which overlies the active area 310. As shown, portions of polysilicon gate layer 320 are selectively removed to define holes 330, 332, and 334 in the polysilicon gate layer. Areas in the active region which are exposed by holes 330, 332, and 334 are heavily doped source and drain (S/D) regions.

As shown in FIG. 3, varactor 300 is an MOS capacitor which includes the polysilicon gate 320, dielectric layer 315, and active area 310. In some embodiments, the S/D regions 330, 332, and 334, etc., are preferably heavily doped in the same conductivity type of the active area. In a specific embodiment, the S/D regions are heavily doped with N-type dopants to facilitate contact formation to the N-type active region. Contact structures 340, 342, and 344, etc., are formed to physically and electrically connect the S/D regions to a conductive layer (not shown in FIG. 3) to form an active area electrode. Contacts, such as 322, 324, and 326, etc. are also formed on the polysilicon gate layer to electrically connect the polysilicon layer to a gate electrode.

Referring to FIG. 3, the parasitic components of varactor 300 can now be analyzed. Let "a" represent a width of S/D regions such as 330, and let "X" be a spacing between two adjacent S/D regions, for example, 330 and 332. The area to perimeter ratio of varactor 300 can be express as $$((a+X)^2 - a^2)/(4*a) = (2*a*X + X^2)/(4*a) \quad \text{(Equation 2)}$$

Comparing equation 2 to equation 1, it can be seen that for the same X, the area to perimeter ration of varactor 300 is larger than that of the finger-type varactor 100. The area to perimeter ratio can be further increased by decreasing "a" or by increasing "X". Of course, there can be other variations, modifications, and alternatives.

Referring still to FIG. 3, the gate resistance of varactor 300 can be lowered by placing contacts to the polysilicon gate, such as 332, close to the edge of S/D regions. Or alternatively, gate resistance can be reduced by decreasing "X". Drain resistance Rd, which measures the resistance in the active area from a S/D contact to the active area under a polysilicon gate width of X, can be reduced by decreasing "X". Reducing these parasitic resistances increases the quality factor (Q) of the varactor. Therefore, a preferred embodiment of the present invention provides techniques for achieving high varactor quality factor. A specific embodiment of the invention improves capacitance tuning range of a varactor. Some embodiments of the invention offer high pattern density and design flexibility. Of course, there can be other variations, modifications, and alternatives.

Figure 4A:
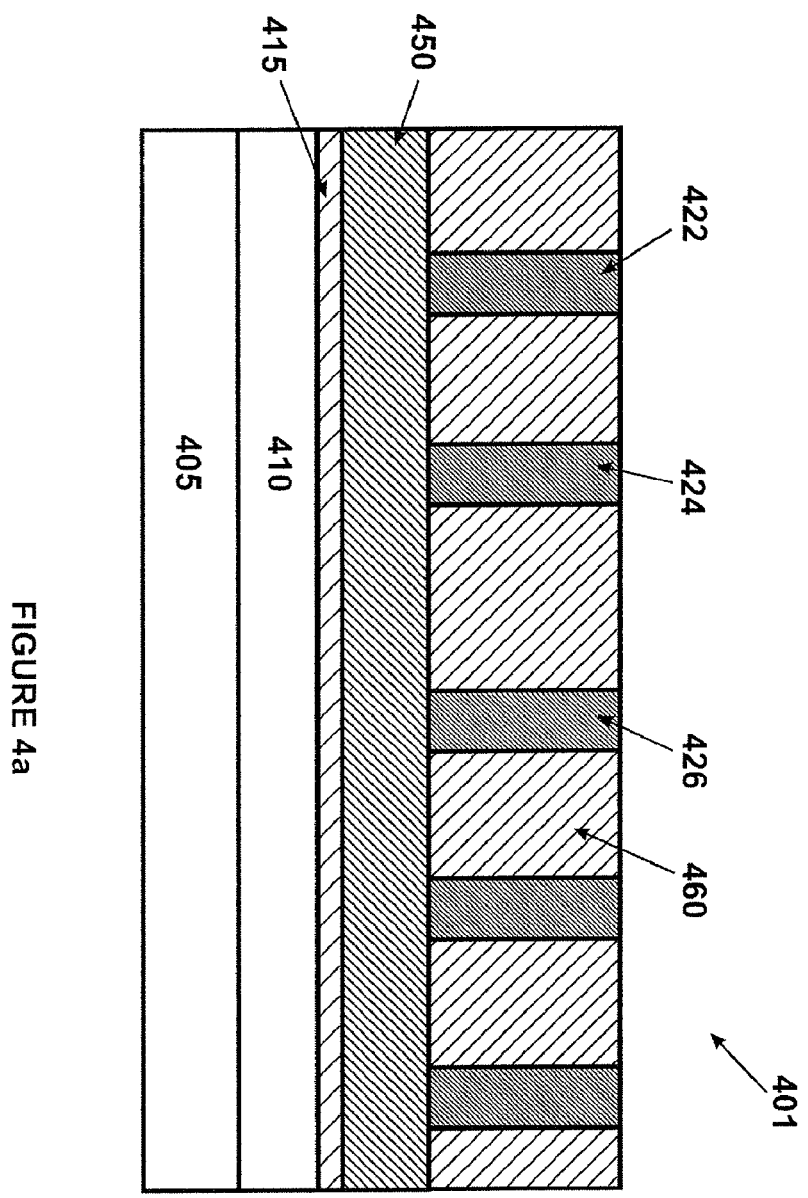
FIG. 4a is a simplified cross-sectional view diagram of a varactor according to an embodiment of the present invention.

FIG. 4a is a simplified cross-sectional view diagram of a varactor 401 according to an embodiment of the present invention. This diagram is merely an example, which should not unduly limit the scope of the claims herein. One of ordinary skill in the art would recognize other variations, modifications, and alternatives. As shown, varactor 401 includes substrate 405, active region 410, gate dielectric 415, and gate layer 450. Contact structures 422, 424, and 426, formed in the dielectric layer 460, are in physical and electrical contact with the gate layer 450. The number and placement of contact structures, such as 422, 424, and 426, are selected to reduce the series resistance of the gate layer. As is known, reduced series resistance improves a quality factor (Q) of a varactor. One of ordinary skill in the art would recognize other variations, modifications, and alternatives.

Figure 4B:
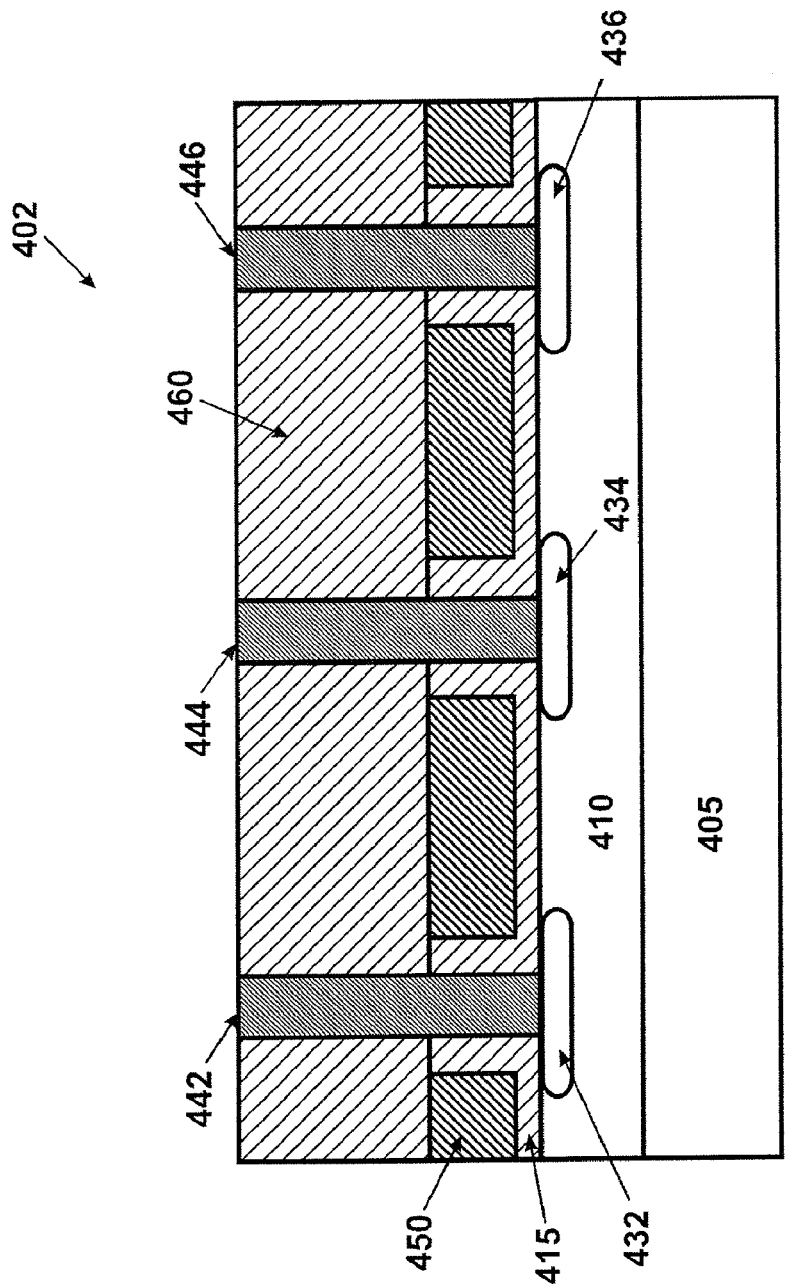
FIG. 4b is another simplified cross-sectional view diagram of a varactor according to an embodiment of the present invention.

FIG. 4b is another simplified cross-sectional view diagram of a varactor 402 according to an embodiment of the present invention. This diagram is merely an example, which should not unduly limit the scope of the claims herein. One of ordinary skill in the art would recognize other variations, modifications, and alternatives. As shown, varactor 402 includes substrate 405, active region 410, gate dielectric 415, and gate layer 450. Varactor 402 also includes highly doped source/drain (S/D) regions 432, 434, and 436. Contact structures 442, 444, and 446 are formed in the dielectric layer 460 to form physical and electrical contacts to the S/D regions. The size, number, and location of contact structures, such as 442, 444, and 446, are selected so as to reduce series resistance of the active region. As is known in the art, a low series resistance improves a quality factor (Q) of a varactor. One of ordinary skill in the art would recognize other variations, modifications, and alternatives.

In a specific embodiment, the S/D regions are associated with square shaped openings (i.e., holes) in the polysilicon gate layer. In other embodiments, the S/D regions can be associated with polygonal shaped or circular shaped openings in the polysilicon gate layer. In some embodiments, the polysilicon gate layer can include a combination of different conductive materials, such as tungsten, titanium, or their silicides. Of course, one of ordinary skill in the art would recognize various alternatives, modifications, and variations.

A method for fabricating a variable capacitor according to an embodiment of the present invention can be briefly outlined below.
1. Provide a semiconductor substrate, such as a silicon wafer;
2. Form an active region in the semiconductor substrate;
3. Form a first dielectric layer overlying the active region;
4. Form a conductive gate layer over the first dielectric layer;
5. Pattern the conductive gate layer to form holes in the conductive gate layer;
6. Implant impurities through the holes in the conductive gate layer;
7. Form a second dielectric layer overlying the conductive gate layer;
8. Pattern the second dielectric layer to form contact holes extending to the active region;
9. Pattern the second dielectric layer to form contact holes to expose the conductive gate Layer;
10. Form first contact structures to be in contact with the active region; and
11. Form second contact structures to be in contact with the conductive gate layer.

The above sequence of steps provides a method for making a variable capacitor according to an embodiment of the present invention. As shown, the method uses a combination of steps including a way of making contacts to the active region through holes in the gate structure. Other alternatives can also be provided where steps are added, one or more steps are removed, or one or more steps are provided in a different sequence without departing from the scope of the claims herein. Further details of the present method can be found throughout the present specification and more particularly below.

Figure 5:
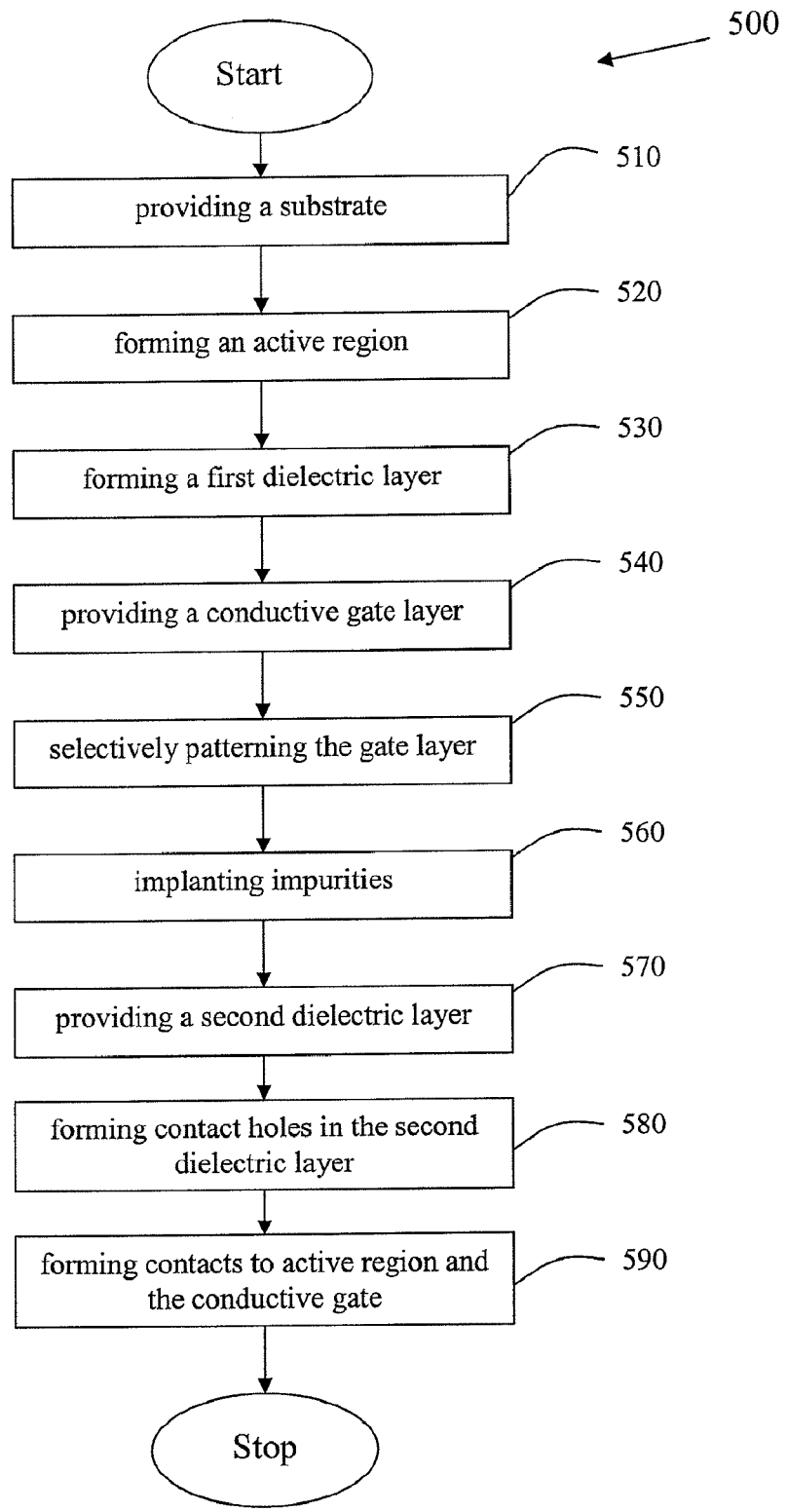
FIG. 5 is a simplified flow diagram of a method for forming a varactor according to an embodiment of the present invention.

FIG. 5 is a simplified flow diagram 500 of a method for making a variable capacitor according to an embodiment of the present invention. This diagram is merely an example, which should not unduly limit the scope of the claims herein. One of ordinary skill in the art would recognize other variations, modifications, and alternatives. As shown, the method includes providing (step 510) a semiconductor substrate (e.g., silicon wafer). The substrate has a surface region. The method includes (step 520) forming an active region within the substrate. In a preferred embodiment, the substrate is characterized by a first conductivity type, for example, P-type, and the active region is characterized by a second conductivity type, for example, N-type. Depending on the embodiments, the substrate can be N-type, and the active region can be P-type. Typically, P-type regions include boron based impurities, and N-type regions include N-type impurities such as arsenic or phosphorus.

In a specific embodiment, the method includes (step 530) forming a dielectric layer (e.g., gate oxide, nitride, silicon oxynitride) overlying the surface region, which extends over the active region. A gate oxide is often formed using a thermal oxidation process to form high quality gate oxide, which is free from voids, etc. Proper dielectric layer thicknesses are often required for devices to operate at different voltages. Depending upon the embodiment, there can be other variations, modifications, and alternatives.

The method also includes forming (step 540) a conductive gate layer overlying the dielectric layer overlying the structures underlying the dielectric layer. In a specific embodiment, the conductive gate layer is a polysilicon film. The film is often doped using impurities to provide conductive characteristics. The film can be doped using diffusion and/or in-situ doping techniques of phosphorus bearing impurities, e.g., phosphine. The film can be a single layer or multiple layers of different materials such as tungsten, titanium, and their silicides, or other metals, depending upon the embodiment.

In a specific embodiment, the method (step 550) selectively patterns portions of the conductive gate layer to form a plurality of holes in the conductive gate layer. For example, a photo resist layer can be used as a mask, and RIE etching can be used to selectively remove polysilicon from the patterned portions to form holes. Alternatively, a hard mask such as a dielectric mask can be used in the etching process. A perimeter of each of the holes is characterized by a predetermined length, and a spacing between two adjacent holes is characterized by a predetermined distance. In some embodiments, the perimeter length and the spacing are selected so as to achieve a predetermined quality factor. For example, larger spacing leads to higher series resistance in the active region and tends to decrease the quality factor. Larger holes tend to result in higher perimeter to area ratio and large parasitic capacitance. Merely as an example, the perimeter length can be less than 0.3 um and the edge-to-edge spacing can be less than 0.13 um. Alternatively, the perimeter length can be less than 0.3 um, and the edge-to-edge spacing can be less than 0.5 um in another embodiment. In a preferred embodiment, the holes are square in shape. Depending upon the embodiments, the holes can be circular or polygonal in shape. Of course, there can be other variations, modifications, and alternatives.

In a specific embodiment, the method includes (step 560) implanting impurities of the second conductivity type into the active region through the plurality of holes in the conductive layer. This implant can increase a conductivity in the active region exposed by the holes in the gate layer. Therefore this implant uses impurities having the same conductivity as the active region. In a specific embodiment, N-type impurities are implanted in this step into an N-type active region. Merely as an example, implant has a dose of arsenic or phosphorus impurities ranging from about $1 \times 10^{15}$ per $cm^2$ to about $5 \times 10^{15}$ per $cm^2$ according to preferred embodiments. Depending upon the embodiment, there can be other variations, modifications, and alternatives.

A second dielectric layer is formed (step 570) overlying the gate layer and the holes. The second dielectric layer often includes CVD oxide, but can also include other dielectrics such as nitride or high density plasma, commonly called HDP oxide. The method then (step 580) patterns the second dielectric layer to form a first plurality of contact holes through the holes in the conductive gate layer. These contact holes expose the active region through the holes in the conductive gate layer. The method also patterns the second dielectric layer to form a second plurality of contact holes to expose the conductive gate layer. The size, number, and location of the contact holes are selected so as to reduce series resistance of the active region. As is known in the art, reduced series resistance improves a quality factor (Q) of a varactor. For example, a large number of contacts to the active area reduce the series resistance in the active area and increase the quality factor. Similarly, a large number of contacts to the gate layer reduces the series resistance of the gate layer and increases the quality factor of the varactor. Therefore, it would be advantageous to reduce a spacing between adjacent contacts. However, a large perimeter length of holes in the conductive gate layer reduces the area to perimeter ratio of the capacitor. As a result, it would be desirable to reduce the size of the holes in the conductive gate layer. Of course, there can be other variations, modifications, and alternatives.

In a specific embodiment, the method (590) forms a first group of conductive contact structures to be in physical and electrical contact with the active region through the holes in the conductive gate layer. The method also forms a second group of conductive contact structures in the second plurality of contact holes to be in physical and electrical contact with the conductive gate layer. In a specific embodiment, the contact structures are formed by depositing a layer of a conductive material, such as aluminum, to fill the contact holes. In some embodiments, the contact structures include tungsten plugs or polysilicon plugs. In certain embodiments, the contact structures can include certain conductive films to improve adhesion and reduce contact resistance. In an embodiment, a first electrode is formed to connect the first group of contact structures that are in contact with the active region, and a second electrode is formed to connect the second group of contact structures that are in contact with the gate layer. Depending upon the embodiments, the electrodes are formed by depositing a conductive layer and patterning the conductive layer. In an embodiment, the conductive layer can be a metallic layer such as aluminum, tungsten, or copper, other metals or their silicides. The first and second electrodes form two terminals of the variable capacitor according to an embodiment of the invention. Of course, there can be other variations, modifications, and alternatives.

The above sequence of steps provides a method for making a variable capacitor according to an embodiment of the present invention. As shown, the method uses a combination of steps including a way of making contact to the active region through openings in the gate structure. Other alternatives can also be provided where steps are added, one or more steps are removed, or one or more steps are provided in a different sequence without departing from the scope of the claims herein. Additionally, although the above has been described in terms of a keyboard device, other devices can also be used. In a specific embodiment, an approximately 20% reduction in device layout area can be achieved compared with a conventional finger type MOS varactor. Of course one skilled in the art would recognize other modifications, variations, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a variable capacitor, the method comprising:
    providing a semiconductor substrate comprising a surface region, the substrate being characterized by a first conductivity type;
    forming an active region within the substrate, the active region being characterized by a second conductivity type;
    forming a first dielectric layer overlying the active region;
    forming a conductive gate layer over the first dielectric layer;
    forming a plurality of discrete holes in the conductive gate layer, each of the discrete holes having a predetermined perimeter length, and two adjacent discrete holes being separated by a predetermined spacing;
    implanting impurities of the second conductivity type into the active region through the plurality of discrete holes in the conductive gate layer;
    after implanting impurities of the second conductivity into the active region, forming a second dielectric layer overlying the conductive gate layer;
    patterning the second dielectric layer to form a first plurality of contact holes extending through the discrete holes in the conductive gate layer to expose the active region;
    patterning the second dielectric layer to form a second plurality of contact holes to expose the conductive gate layer;
    forming a first plurality of conductive contact structures in the first plurality of contact holes, the first plurality of conductive contact structures being in physical contact with the active region; and
    forming a second plurality of conductive contact structures in the second plurality of contact holes, the second plurality of conductive contact structures being in physical contact with the conductive gate layer, wherein a portion of the conductive layer having the discrete holes formed therein is a single electrode.

2. The method of claim 1, wherein the predetermined perimeter length and the predetermined spacing are selected so as to achieve a predetermined quality factor.

3. The method of claim 1, wherein the predetermined perimeter length is less than 0.3 um, and the predetermined spacing is less than 0.13 um.

4. The method of claim 1, wherein the predetermined perimeter length is less than 0.3 um, and the predetermined spacing is less than 0.5 um.

5. The method of claim 1, wherein the first dielectric layer is characterized by a thickness in a range of about between 5 nm to about and 20 nm.

6. The method of claim 1, wherein the first dielectric layer is characterized by a thickness in a range of about between 20 nm to about and 100 nm.

7. The method of claim 1 further comprising:
    forming a first electrode coupled to the first plurality of conductive contact structures; and
    forming a second electrode coupled to the second plurality of conductive contact structures.

8. The method of claim 1, wherein the first conductivity type is P-type and the second conductivity type is N-type.

9. The method of claim 1, wherein the first conductivity type is N-type and the second conductivity type is P-type.

10. The method of claim 1, wherein the holes are square in shape.

11. The method of claim 1, wherein the holes are circular in shape.

12. The method of claim 1, wherein the holes are polygon in shape.

13. The method of claim 1, wherein the conductive gate layer comprises polysilicon.

14. The method of claim 1, wherein implementing impurities comprises a dose of arsenic impurities or phosphorus impurities ranging from about $1\times10^{15}$ per $cm^2$ to about $5\times10^{15}$ per $cm^2$.

15. The method of claim 1 further comprising a plurality of source/drain regions in the active region, the source/drain regions having a higher conductivity than a conductivity of the active region.

16. The method of claim 15, wherein at least one of the source/drain regions is associated with one of the holes.

* * * * *